(12) United States Patent
Liu et al.

(10) Patent No.: US 6,492,871 B2
(45) Date of Patent: Dec. 10, 2002

(54) CURRENT FEEDBACK OPERATIONAL AMPLIFIER

(75) Inventors: Hung-Chih Liu; Stanley Liao, both of Hsinchu (TW)

(73) Assignee: Silicon Integrated Systems Corp., Hsin-Chu (TW)

( * ) Notice: Subject to any disclaimer, the term of this patent is extended or adjusted under 35 U.S.C. 154(b) by 18 days.

(21) Appl. No.: 09/751,981

(22) Filed: Dec. 29, 2000

(65) Prior Publication Data

US 2002/0084851 A1 Jul. 4, 2002

(51) Int. Cl.[7] .................................................. H03F 3/45
(52) U.S. Cl. ........................ 330/257; 330/259; 330/260
(58) Field of Search ................................. 330/257, 260, 330/259

(56) References Cited

U.S. PATENT DOCUMENTS

| | | | |
|---|---|---|---|
| 5,515,006 A | * 5/1996 | Chan | 330/255 |
| 5,585,763 A | * 12/1996 | Navabi et al. | 330/255 |
| 5,734,293 A | * 3/1998 | Gross | 323/316 |
| 5,999,045 A | * 12/1999 | Claverie et al. | 330/11 |
| 6,028,479 A | 2/2000 | Babanezhad | 330/253 |
| 6,114,686 A | * 9/2000 | Funahashi | 250/214 A |

OTHER PUBLICATIONS

Abou–Allam, E. et al. "A 200 MHz Steered Current Operational Amplifier in 1–2 –um CMOS Technology. " IEEE Journal of Solid–State Circuits, vol. 32 No. 2(1997) pp245–249.
Kaulberg, T. "A CMOS Current–Mode Operational Amplifier." IEEE Journal of Solid–State Circuits, vol. 28, No. 7 (1993) pp 849–852.

* cited by examiner

Primary Examiner—Patricia Nguyen
(74) Attorney, Agent, or Firm—Ladas & Parry

(57) ABSTRACT

The present invention discloses a current feedback operational amplifier, whose input ends are connected to a first amplifier which transmits an output to the gate terminals of at least one input pair of current switches, and the source terminal of one transistor of the input pair of current switches is connected to one of the input ends. Therefore, a negative feedback loop will be established by the first amplifier and the input pair of current switches. By means of the negative feedback loop, the input impedance, offset voltage and gain error are all reduced. The input impedance of the present invention is reduced as 1/1+A times as the original one. Therefore, the aspect ratio of the transistors of the input pair of current switches is reduced.

11 Claims, 8 Drawing Sheets

CURRENT FEEDBACK OPERATIONAL AMPLIFIER

BACKGROUND OF THE INVENTION

1. Field of the Invention

The present invention relates to a current feedback operational amplifier, and particularly to a current feedback operational amplifier in which a negative feedback loop is formed by input ends and an input pair of current switches for enhancing gains.

2. Description of Related Art

In general, the slew rate and bandwidth of a current feedback operational amplifier are larger than that of a voltage feedback operational amplifier, and is more suitable for a low power operation. Therefore, the current feedback operational amplifier is usually used in a line driver to drive a large load.

FIG. 1 shows a prior art circuit of a current feedback operational amplifier, comprises a CCII+ (second generation current conveyor) 11 and an output stage 12. The current conveyor 11 has two types: class A and class A/B. The input of the class A current conveyor 11 has a more accurate frequency response and more suitable for a low voltage operation. The class A/B current conveyor 15 has a better slew rate and S/N ratio (signal to noise ratio).

FIG. 2(a) shows a prior art circuit of a class A/B circuit conveyor, disclosed by Thomas Kaulberg in "A CMOS Current-Mode Operational Amplifier," IEEE Journal of Solid-State Circuits, Vol.28, No.7, pp.849–852, July 1993. Besides, U.S. Pat. No. 6,028,479, titled "LOW VOLTAGE TRANSMISSION LINE DRIVER" also discloses a similar fully differential circuit.

An input signal of an ideal current conveyor is current; therefore, the input impedance at a terminal X is zero. In the circuit shown in FIG. 2, the input impedance at terminal X is $(g_{m2}+g_{m4})^{-1}$. For achieving a lower input impedance, the aspect ratio and bias current of transistors M2 and M4 are designed as larger ones, and therefore occupy a large area. Besides, the problems of a large offset voltage and gain error still exist. For improving the performance of the prior art circuit, a feedback loop is established to reduce the input impedance, shown in FIG. 2(b). The prior art circuit is disclosed by Eyad Abou-Allam in "A 200 MHz Steered Current Operational Amplifier in 1.2 μm CMOS Technology," IEEE Journal of Solid-State Circuits, Vol.32, No.2, February 1997. According to a feedback theorem, the input impedance of the prior art circuit is reduced as $(1+Av)^{-1}$ times as the original one, and that is $(g_{m1})^{-1}/(1+Av)$. However, the prior art circuit belongs to a class A current conveyor, and cannot be applied in a class A/B current conveyor.

SUMMARY OF THE INVENTION

A first object of the present invention is to reduce the design complexity of a current feedback operational amplifier.

A second object of the present invention is to reduce input impedances of a current feedback operational amplifier.

A third object of the present invention is to improve aspect ratio and bias current of transistors included in a current feedback operational amplifier.

A fourth object of the present invention is to improve the problems of offset voltage and gain error happened occurring in a current feedback operational amplifier.

For achieving the above objects, the present invention proposes a current feedback operational amplifier, in which a first and second input ends are connected to a first amplifier which transmits an output to the gate terminals of at least one input pair of current switches, and the source terminal of one of the input pair of current switches is connected to the first input end. Therefore, a negative feedback loop is established by the first amplifier and input pair of current switches. By means of the negative feedback loop, the input impedance, offset voltage and gain error are all reduced. The input impedance of the present invention is $(g_{m2}+g_{m4})^{-1}/(1+A)$, wherein A is the gain of the amplifier, $g_{m2}$ and $g_{m4}$ are transconductances of transistors M2 and M4, respectively. The input impedance is reduced as $1/1+A$ times as the original one. Therefore, the aspect ratio of transistors M2 and M4 is reduced.

The first embodiment of the current feedback operational amplifier has a first and a second input end, comprising a current conveyor and an output stage. The current conveyor includes a first amplifier and at least one input pair of current switches, characterized in that said first and second input ends function as inputs of said first amplifier. The output of said first amplifier is electrically connected to gate terminals of said at least one input pair of current switches, and a source terminal of one transistor of said at least one input pair of current switches is connected to said first input end. The output stage is connected to said current conveyor for enhancing the output driving capability. Therefore, a negative feedback loop is established to enhance gains and to reduce input impedance.

The second embodiment of the current feedback operational amplifier has a first and a second input end and a first output end, comprising current conveyor and an output stage. The current conveyor includes a first amplifier, input pair of current switches and a current mirror. The input end of the first amplifier is connected to said first and second input ends. The gate terminals of input pair of current switches are connected to the output of said first amplifier, and a source terminal of one transistor of said input pair of current switches is connected to said first input end. The source terminals of the current mirror are connected to source terminals of said input pair of current switches. The output stage is connected to said current conveyor for enhancing output driving capability and transmitting an output to said first output end.

The third embodiment of the current feedback operational amplifier has a first and a second input end and a first and a second output end, comprising a current conveyor and an output stage. The current conveyor includes a first amplifier, two input pairs of current switches and two current mirrors. The input end of the first amplifier is connected to said first and second input ends. The gate terminals of the two input pairs of current switches are connected to the output of said first amplifier respectively, and source terminals of one transistor of each said two input pairs of current switches connected to said first and second input ends respectively. The source terminals of-the two current mirrors are connected to the source terminals of said two input pair of current switches. The output stage is connected to said current conveyor for enhancing output driving capability and transmitting an output to said first and second output ends.

Besides, some transistors of the output stage are designed by a negative feedback loop for enhancing gain.

BRIEF DESCRIPTION OF THE DRAWINGS

The present invention will be described according to the appended drawings in which.

PREFERRED EMBODIMENT OF THE PRESENT INVENTION

Figure 1:
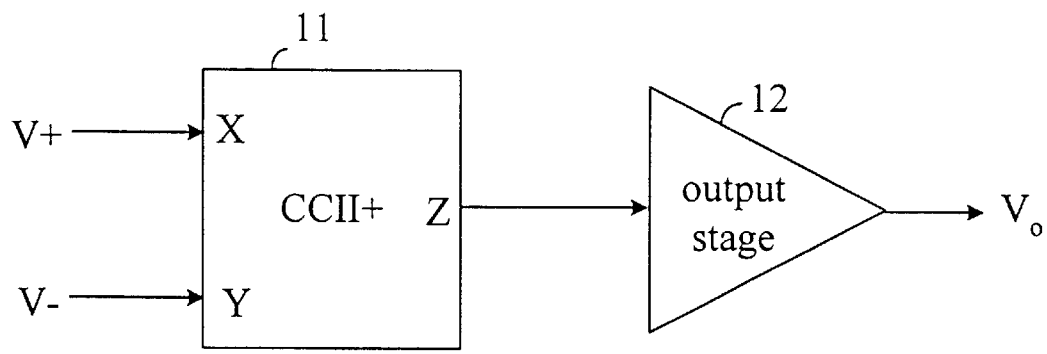
FIG. 1 shows a prior art circuit of a current feedback operational amplifier.
Figure 2A:
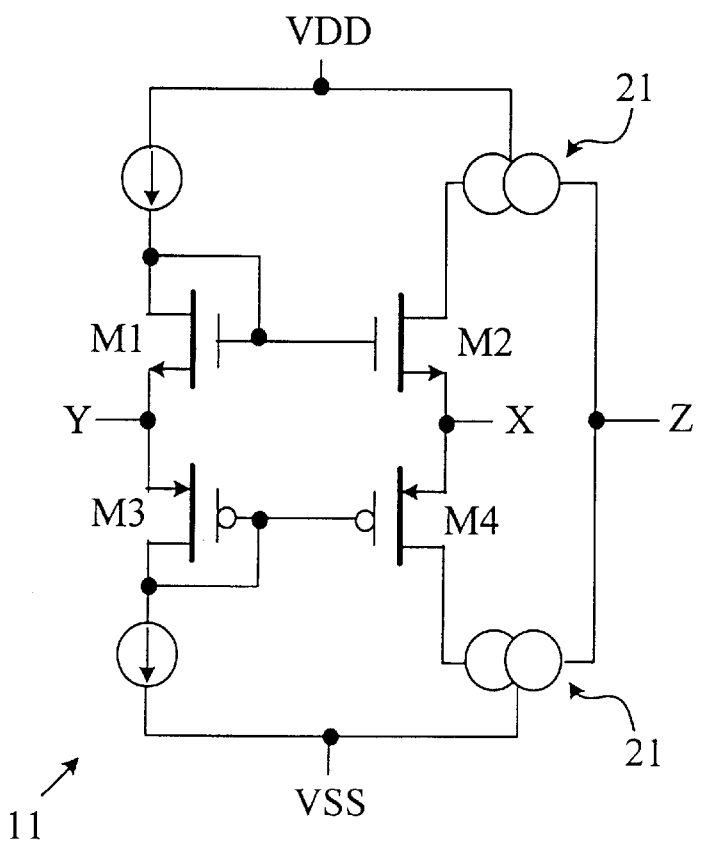
FIGS. 2(a) and 2(b) show prior art circuits of a class A/B circuit conveyor.
Figure 2B:
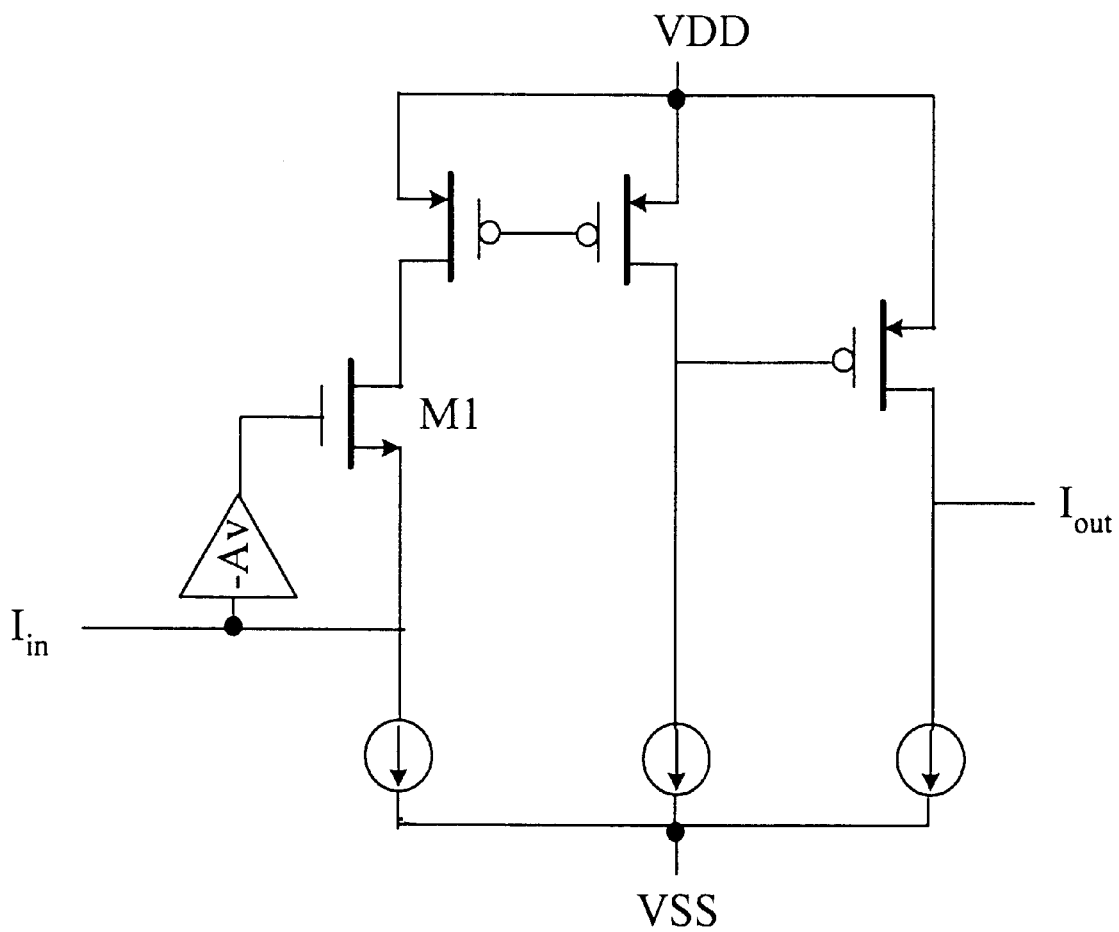
Figure 3A:
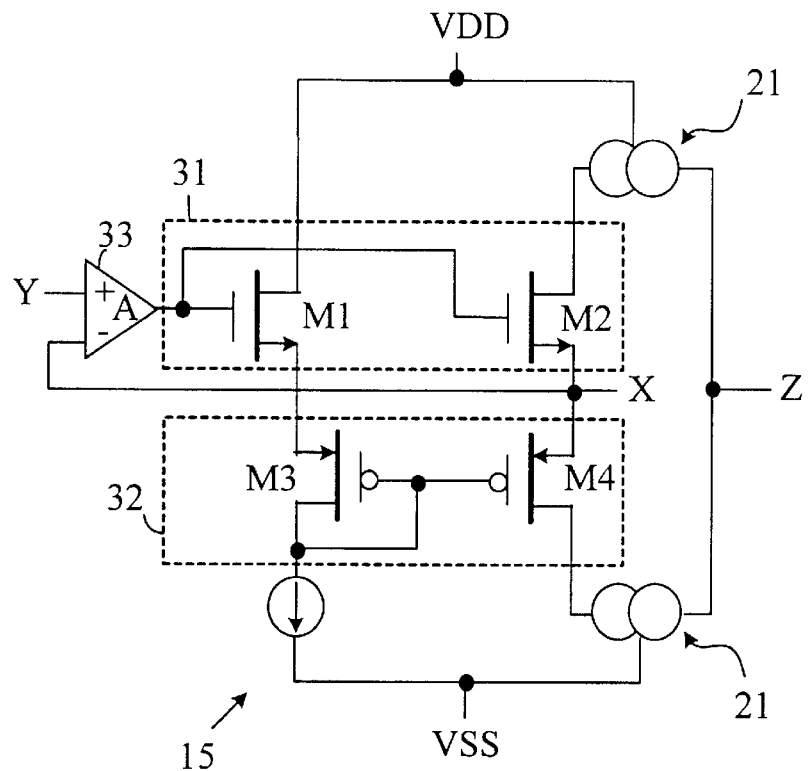
FIGS. 3(a) and 3(b) show circuits of first embodiments of a class A/B circuit conveyor according to the present invention.
Figure 3B:
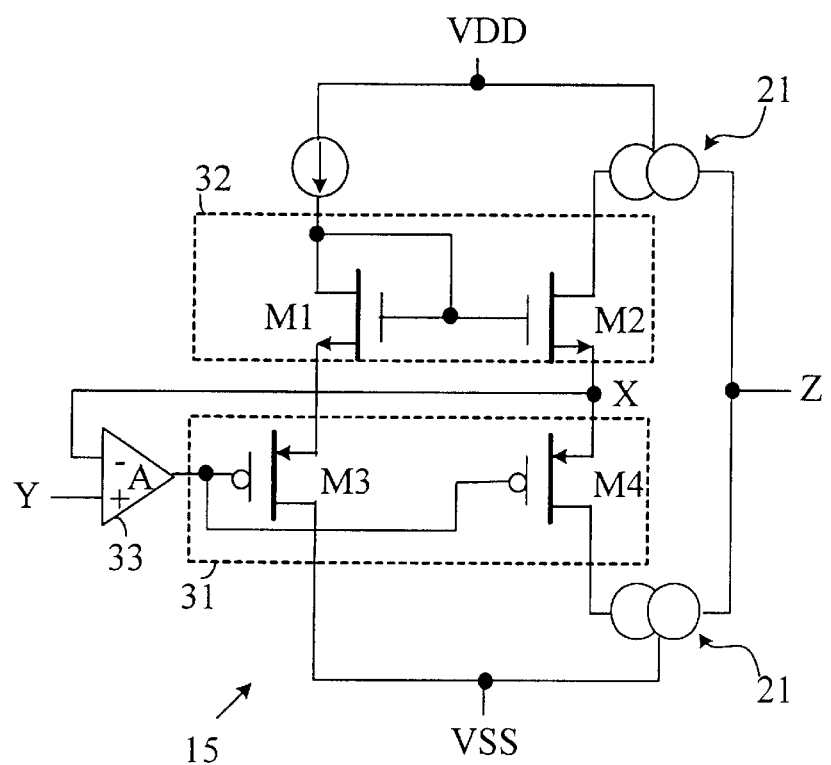

FIGS. 3(a) and 3(b) show circuits of first embodiment of a class A/B circuit conveyor 15 according to the present invention. In FIG. 3(a), transistors M1 and M2 are formed as an input pair of current switches 31 whose gate terminals are electrically connected to the output of a first amplifier 33. The inputs of the first amplifier 33 are connected to the input X and Y of the class A/B current conveyor 15. Thus, a feedback loop is formed by the first amplifier 33 and transistor M2 for enhancing gains. By the feedback loop, the input impedance, offset voltage and gain error will be reduced. The difference from the prior art circuits is that the input impedance of the class A/B current conveyor 15 of the present invention is $(g_{m2}+g_{m4})^{-1}/(1+A)$, wherein A is the gain of the amplifier. Since the input impedance of the present invention is as $1/(1+A)$ times as the original one, the aspect ratio and static current of the transistors M2 and M4 can be reduced. Transistors M3 and M4 are formed as a current mirror 32 whose source terminals are respectively connected to the source terminals of the input pair of current switches 31 for fixing a current ratio of the current of transistor M1 to that of transistor M2. The phase of the current mirror 32 is opposite to that of the input pair of current switches 31. In other words, if the current mirror 32 is formed by P type transistors, the input pair of current switches 31 is formed by N type transistors; or if the current mirror 32 is formed by N type transistors, the input pair of current switches 31 is formed by P type transistors. The drain terminals of transistors M2 and M4 are connected to current mirrors 21 for duplicating a proportional output current Z.

In FIG. 3(b), M3 and M4 are formed as an input pair of current switches 31 whose gate terminals are electrically connected to the output of the first amplifier 33, and the inputs of the first amplifier 33 are respectively connected to the inputs X and Y of the class A/B current conveyor 15. Since the source terminal of the transistor M4 is connected to the input X of the class A/B current conveyor 15, a feedback loop is formed by the first amplifier 33 and transistor M4 for enhancing gains and reducing input impedance. As the same theorem with the theorem illustrated in FIG. 3(a), the aspect ratio of the transistors M3 and M4 can be reduced. Besides, in FIG. 3(b), transistors M1 and M2 are formed as a current mirror 32 whose source terminals are connected to the source terminals of the input pair of current switches 31.

Figure 4A:
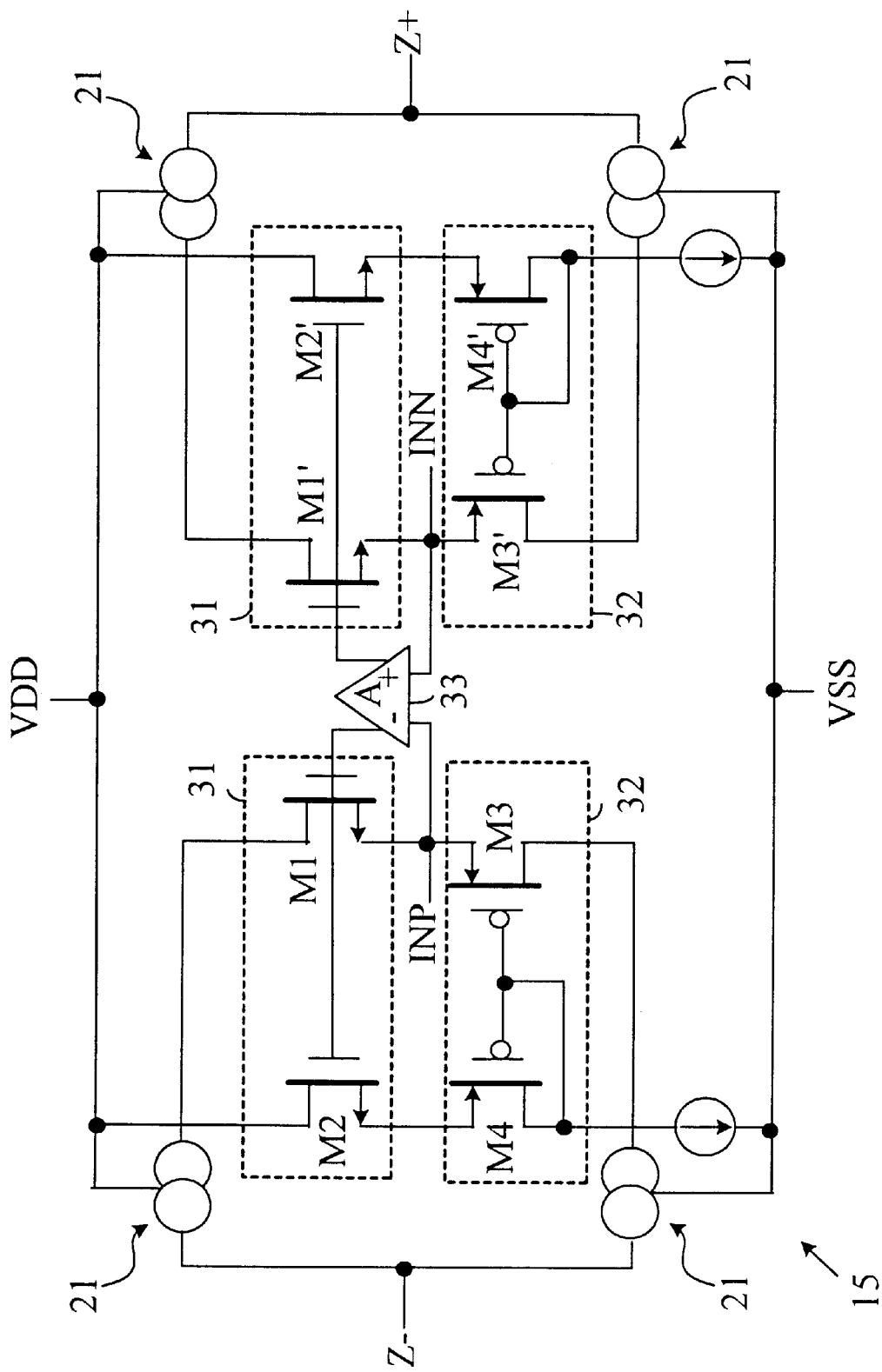
FIGS. 4(a) and 4(b) show circuits of second embodiments of a class A/B circuit conveyor according to the present invention.
Figure 4B:
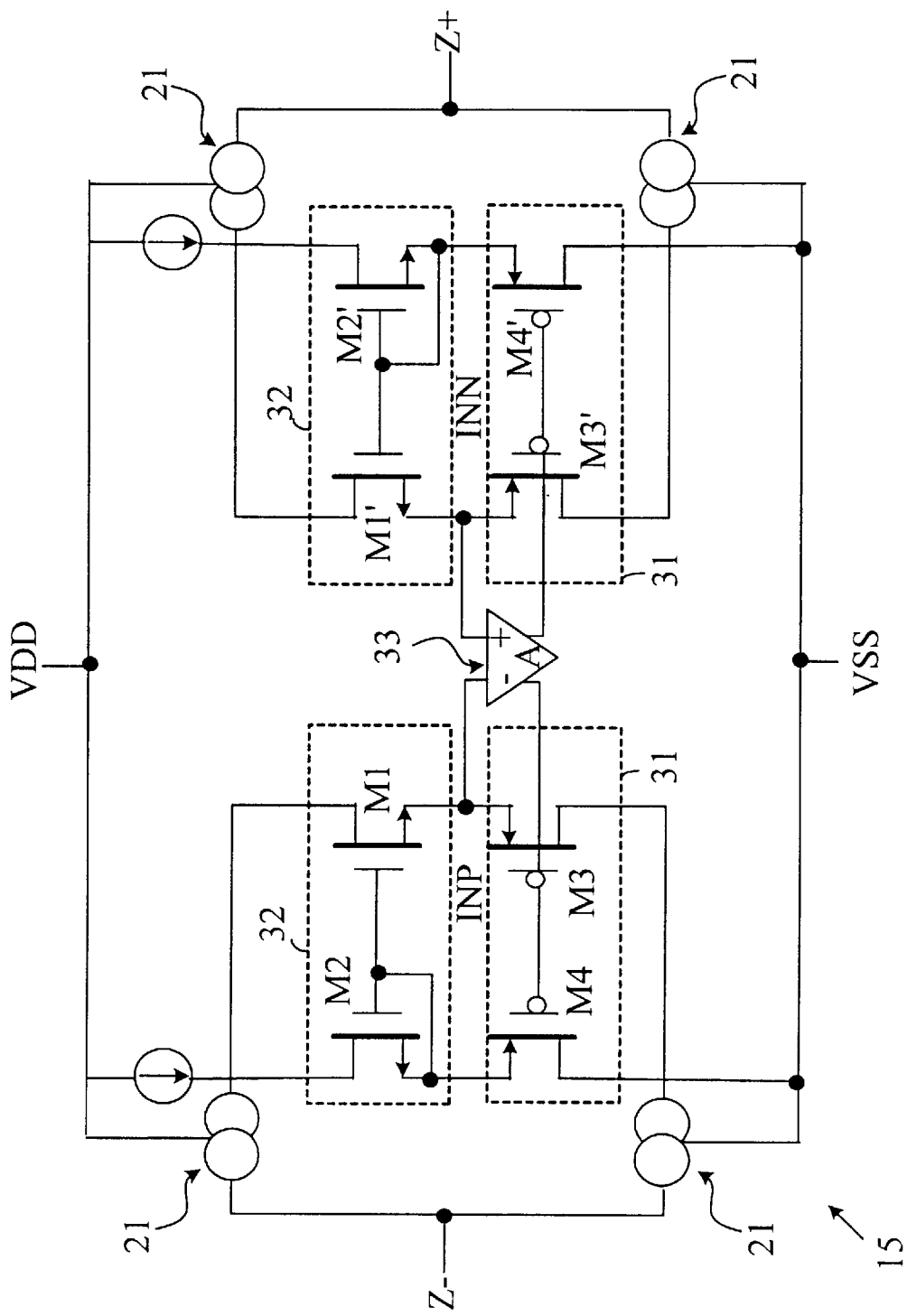

FIGS. 4(a) and 4(b) show circuits of second embodiments of a class A/B circuit conveyor according to the present invention. FIGS. 3(a) and 3(b) are circuits having a single-ended output, and FIGS. 4(a) and 4(b) show circuits having a fully differential output. The circuit in FIG. 4(a) is formed by combining two circuits of FIG. 3(a) in a face-to-face manner, and has two outputs Z− and Z+. Transistors M1 and M2 and transistors M1' and M2' are formed as input pairs of current switches 31 respectively, and transistors M3 and M4 and transistors M3' and M4' are formed as current mirrors 32. The gate terminals of transistors M1 and M1' are connected to the output of the first amplifier 33. The "+ input" of the first amplifier 33 is connected to the input INN of the class A/B current conveyor 15. The "− input" of the first amplifier 33 is connected to the input INP of the class A/B current conveyor 15. The source terminal of the transistor M1 is connected to the input INP of the class A/B current conveyor 15, and the source terminal of the transistor M1' is connected to the input INN of the class A/B current conveyor 15. Therefore, a feedback loop is established by the first amplifier 33 and transistors M1 and M1', and the gains of the transistors M1, M1', M2 and M2' are raised and their input impedances are reduced. As the same theorem with the theorem of FIG. 3(a), the aspect ratio of the transistors M2 and M4 and the transistors M2' and M4' are reduced.

The circuit in FIG. 4(b) is formed by combining two circuits in FIG. 3(b) in a face-to-face manner, and has two outputs Z− and Z+. Transistors M3 and M4 and transistors M3' and M4' are formed as input pairs of current switches 31 respectively, and transistors M1 and M2 and transistors M1' and M2' are formed as current mirrors 32. The gate terminals of the transistors M3 and M3' are connected to the output of the first amplifier 33. The "+ input" of the first amplifier 33 is connected to the input INN of the class A/B current conveyor 15. The "− input" of the first amplifier 33 is connected to the input INP of the class A/B current conveyor 15. The source terminal of the transistor M3 is connected to the input INP of the class A/B current conveyor, and the source terminal of the transistor M3' is also connected to the input INN of the class A/B current conveyor 15. Therefore, a feedback loop will be established by the first amplifier 33 and the transistors M3 and M3', and the gains of the transistors M1, M1', M2 and M2' are raised and their input impedances are reduced. As the same theorem with the theorem of FIG. 3(b), the aspect ratio of the transistors M2 and M4 and the transistors M2' and M4' are reduced.

Figure 5:
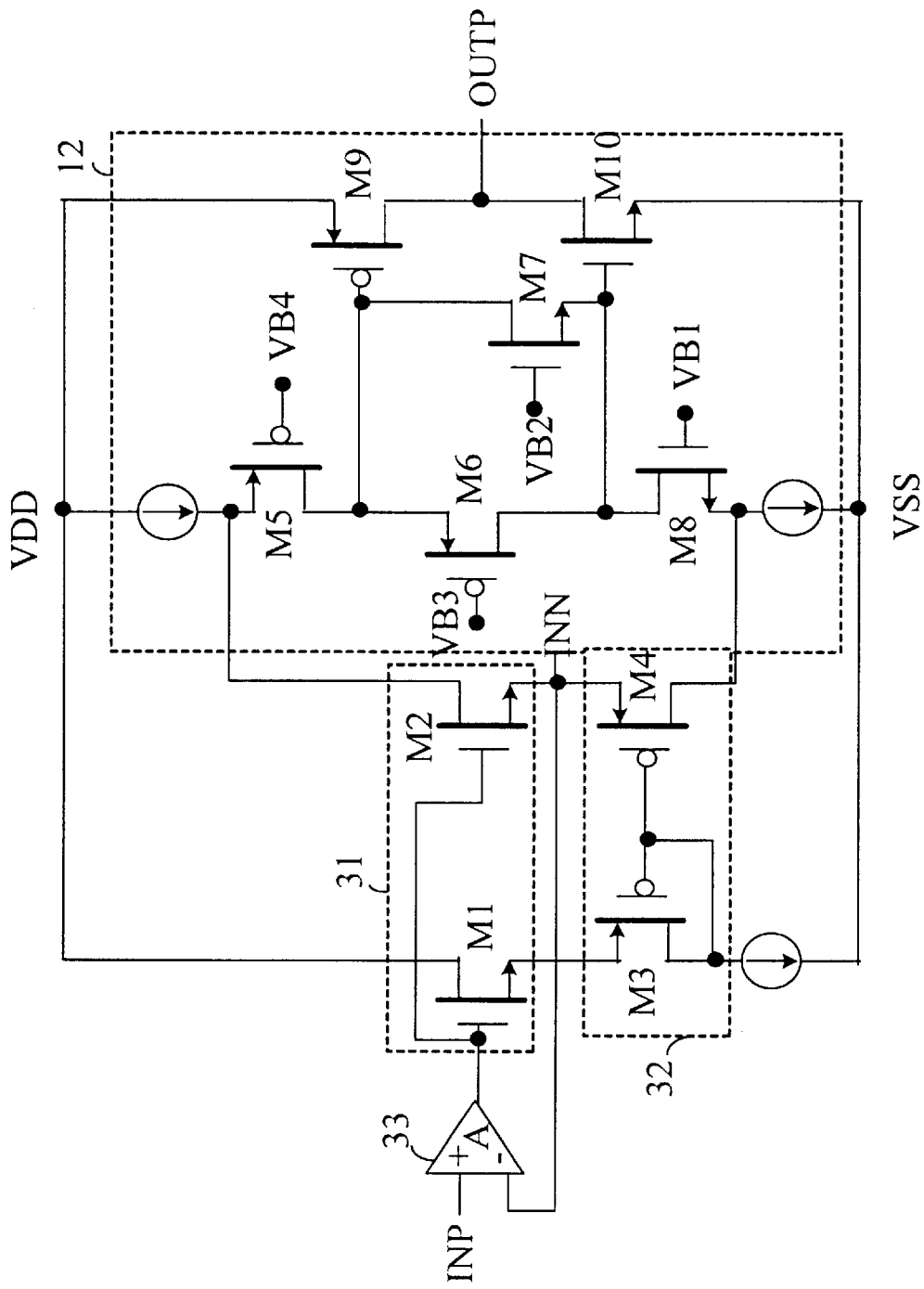
FIG. 5 shows a circuit of a first embodiment of a current feedback operational amplifier according to the present invention.

FIG. 5 shows a circuit of a first embodiment of a current feedback operational amplifier according to the present invention. The circuit is formed by combining the class A/B current conveyor in FIG. 3(a) and a prior art output stage 12 which is formed by transistors M5, M6, M7, M8, M9 and M10. VB1, VB2, VB3 and VB4 represent DC bias voltages. Apparently, the circuit can also be combined by a class A/B current conveyor 15 and a prior art output stage 12 in FIG. 3(b).

Figure 6:
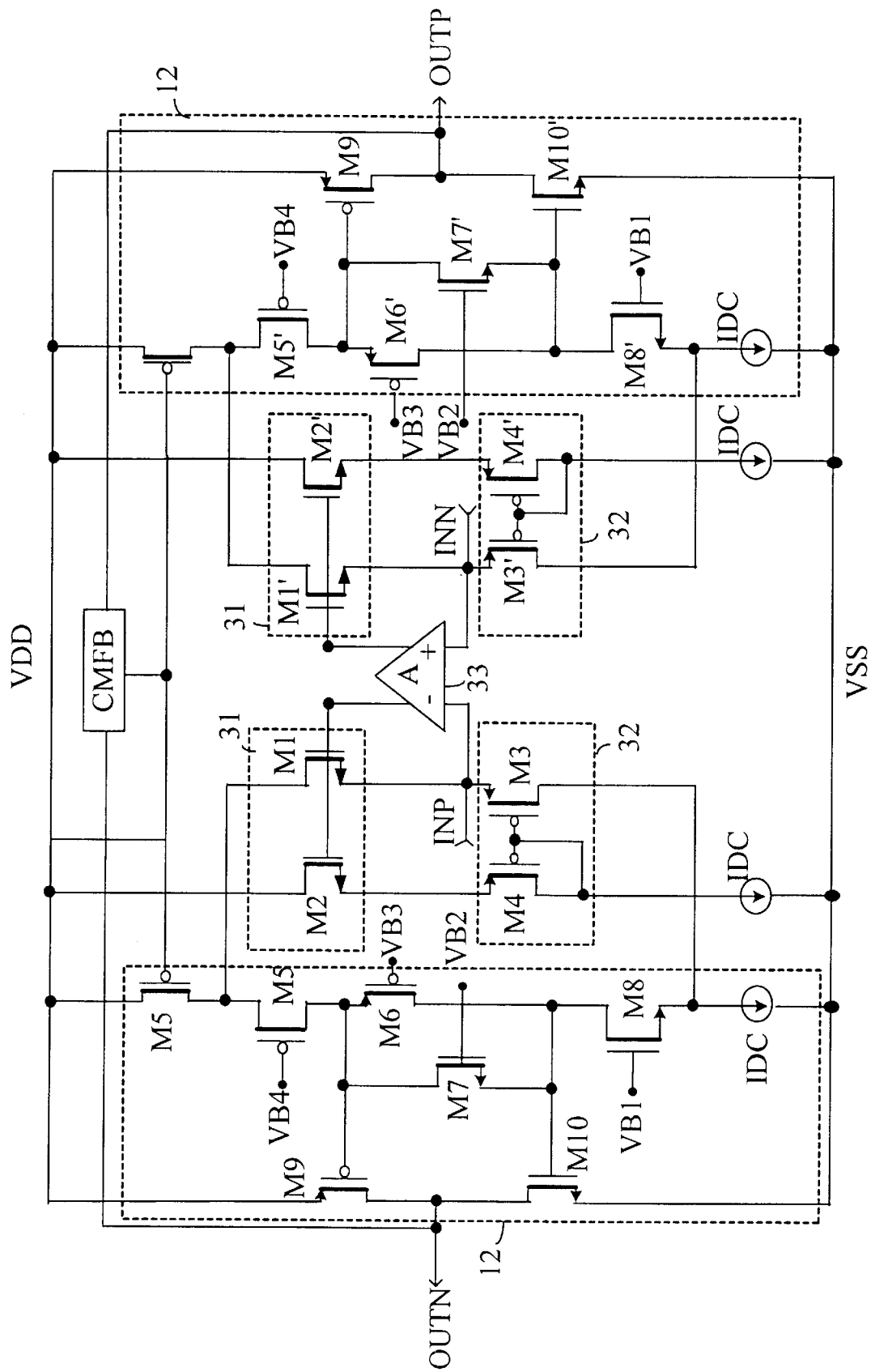
FIG. 6 shows a circuit of a second embodiment of a current feedback operational amplifier according to the present invention.

FIG. 6 shows a circuit of a second embodiment of a current feedback operational amplifier according to the present invention. The circuit in FIG. 5 has a single-ended output, and the circuit in FIG. 6 has a fully differential output. The circuit of FIG. 6 is formed by combining the class A/B current conveyor 15 in FIG. 4(a) and a prior art stage 12. The prior art stage 12 is formed by transistors M5, M5', M6, M6', M7, M7', M8, M8', M9, M9', M10 and M10'. VB1, VB2, VB3 and VB4 represent DC bias voltages. Apparently, the circuit can also be formed by combining the class A/B current conveyor 15 and the prior art output stage 12. A CMFB (Common Mode Feedback) circuit is built between the differential outputs OUTP and OUTN for eliminating common mode factors and increasing CMRR (Common Mode Rejection Ratio).

Figure 7:
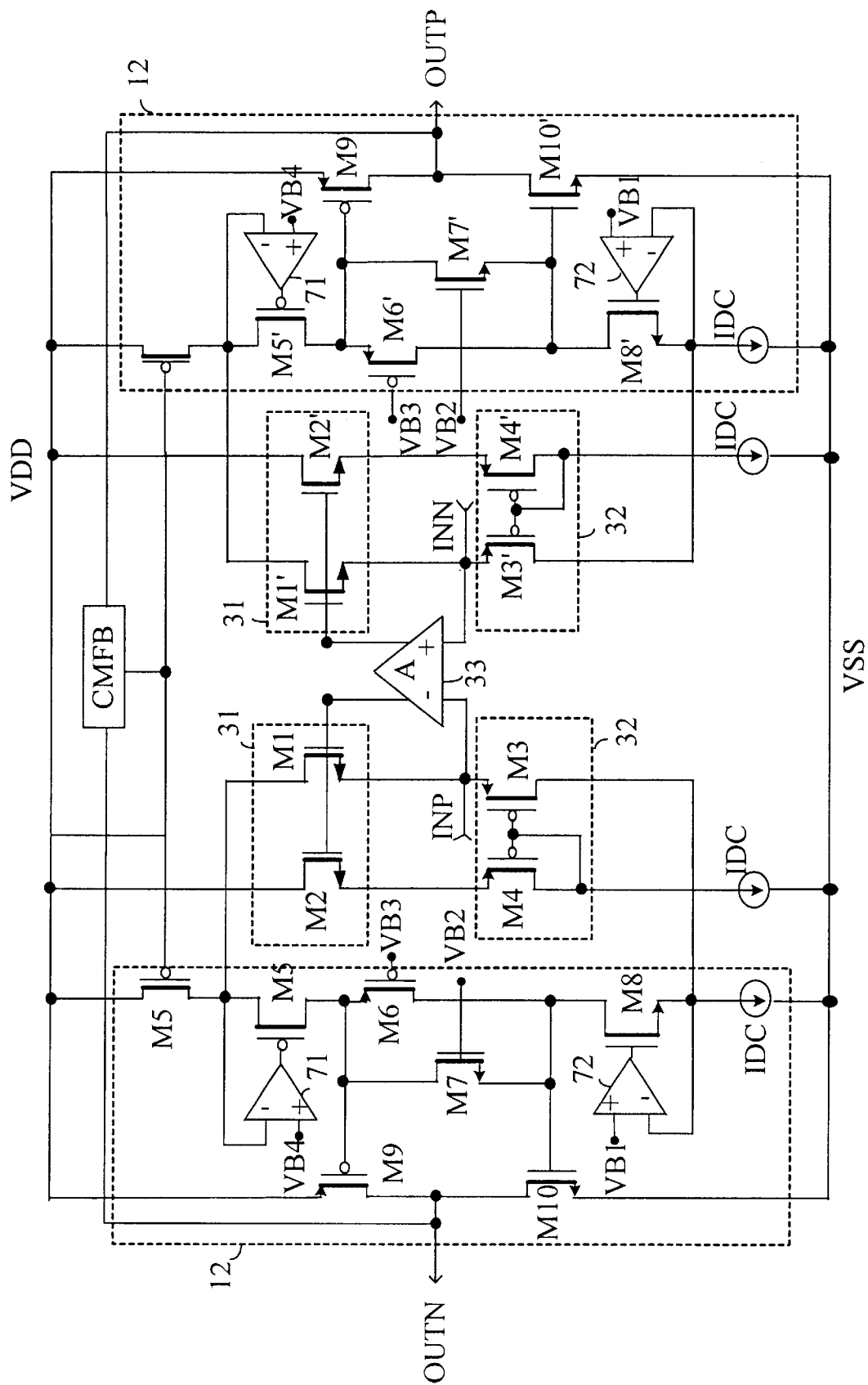
FIG. 7 shows a circuit of a third embodiment of a current feedback operational amplifier according to the present invention.

FIG. 7 shows a circuit of a third embodiment of a current feedback operational amplifier according to the present invention, and used to improve the circuit in FIG. 6. The circuit in FIG. 7 is formed by establishing several negative feedback loops between transistors in the output stage 12. For example, the outputs of two second amplifiers 71 are connected to the gate terminals of transistors M5 and M5', and the inputs of the second amplifiers 71 are connected to the drain terminals of transistors M1 and M1' and a first bias voltage VB4. In addition, the outputs of two third amplifiers 72 may be connected to the gate terminals of transistors M8 and M8', and the inputs of the second amplifiers 72 are connected to the drain terminals of transistors M3 and M3' and a second bias voltage VB1.

The above-described embodiments of the present invention are intended to be illustrated only. Numerous alternative embodiments may be devised by those skilled in the art without departing from the scope of the following claims.

What is claimed is:

1. A current feedback operational amplifier having a first and a second input end, comprising:
   a current conveyor including a first amplifier and at least one input pair of current switches, characterized in that said first and second input ends function as inputs of said first amplifier, the output of said first amplifier is electrically connected to gate terminals of said at least one input pair of current switches, and a source terminal of one transistor of said at least one input pair of current switches is connected to said first input end; and
   an output stage connected to said current conveyor for enhancing the output driving capability;
   whereby a negative feedback loop is established to enhance gains and to reduce input impedance,
   wherein said current conveyor further includes at least one current mirror which is electrically connected to said at least one input pair of current switches, and the phase of said at least one input pair of current switches is opposite to that of said at least one current mirror.

2. The current feedback operational amplifier of claim 1, further comprising a second amplifier, wherein a drain terminal of one transistor of said at least one input pair of said current switches and a first bias voltage are electrically connected to the input of said second amplifier, and the output of said second amplifier is electrically connected to a gate terminal of one transistor of said output stage, whereby a negative feedback loop is established to enhance gains.

3. The current feedback operational amplifier of claim 1, further comprising a third amplifier, wherein a drain terminal of one transistor of said at least one current mirror and a second bias voltage are electrically connected to the input of said third amplifier, and the output of said third amplifier is electrically connected to a gate terminal of one transistor of said output stage, whereby a negative feedback loop is established to enhance gains.

4. A current feedback operational amplifier, having a first and a second input end and a first output end, comprising:
   a current conveyor including:
      a first amplifier whose input end is connected to said first and second input ends;
      an input pair of current switches whose gate terminals are connected to the output of said first amplifier, and a source terminal of one transistor of said input pair of current switches connected to said first input end; and
      a current mirror whose source terminals are connected to source terminals of said input pair of current switches; and
   an output stage connected to said current conveyor for enhancing output driving capability and transmitting an output to said first output end.

5. The current feedback operational amplifier of claim 4, wherein the phase of said input pair of current switches is opposite to that of said current mirror.

6. The current feedback operational amplifier of claim 4, further comprising a second amplifier, wherein a drain terminal of one transistor of said input pair of current switches and a first bias voltage are electrically connected to the input of said second amplifier, and the output of said second amplifier is electrically connected to a gate terminal of one transistor of said output stage; whereby a negative feedback loop is established to enhance gains.

7. The current feedback operational amplifier of claim 4, further comprising a third amplifier, wherein a drain terminal of one transistor of said input pair of current switches and a second bias voltage are electrically connected to the input of said third amplifier, and the output of said third amplifier is electrically connected to a gate terminal of one transistor of said output stage; whereby a negative feedback loop is established to enhance gains.

8. A current feedback operational amplifier, having a first and a second input end and a first and a second output end, comprising:
   a current conveyor including:
      a first amplifier whose input end is connected to said first and second input ends;
      two input pairs of current switches whose gate terminals are connected to the output of said first amplifier respectively, and source terminals of one transistor of each said two input pairs of current switches connected to said first and second input ends respectively; and
      two current mirrors whose source terminals are connected to the source terminals of said two input pair of current switches; and
   an output stage connected to said current conveyor for enhancing output driving capability and transmitting an output to said first and second output ends.

9. The current feedback operational amplifier of claim 8, wherein the phase of said input pair of current switches is opposite to that of said current mirror.

10. The current feedback operational amplifier of claim 8, further comprising a second amplifier, wherein a drain terminal of one transistor of said input pair of current switches and a first bias voltage are electrically connected to the input of said second amplifier, and the output of said second amplifier is electrically connected to a gate terminal of one transistor of said output stage; whereby a negative feedback loop is established to enhance gains.

11. The current feedback operational amplifier of claim 8, further comprising a third amplifier, wherein a drain terminal of one transistor of said input pair of current switches and a second bias voltage are electrically connected to the input of said third amplifier, and the output of said third amplifier is electrically connected to a gate terminal of one transistor of said output stage; whereby a negative feedback loop is established to enhance gains.

* * * * *